US006836191B2

United States Patent
Fujidai et al.

(10) Patent No.: US 6,836,191 B2
(45) Date of Patent: Dec. 28, 2004

(54) VOLTAGE-CONTROLLED OSCILLATOR HAVING A TRANSMISSION LINE BETWEEN A RESONATOR AND A VARIABLE CAPACITANCE DIODE, HIGH-FREQUENCY MODULE INCLUDING THE SAME, AND COMMUNICATION APPARATUS INCLUDING THE SAME

(75) Inventors: Masanori Fujidai, Yokohama (JP); Hiroshi Nishida, Yokohama (JP); Takahiro Baba, Yokohama (JP); Satoshi Shinoda, Sagamihara (JP); Koichi Sakamoto, Yokohama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/435,454

(22) Filed: May 12, 2003

(65) Prior Publication Data

US 2003/0231074 A1 Dec. 18, 2003

(30) Foreign Application Priority Data

May 28, 2002 (JP) ........................................ 2002-154134

(51) Int. Cl.[7] .................................................. H03B 5/12
(52) U.S. Cl. ............................ 331/177 V; 331/117 FE; 331/117 D
(58) Field of Search ....................... 331/177 V, 117 FE, 331/117 D, 74; 333/204, 202, 219.1

(56) References Cited

U.S. PATENT DOCUMENTS 5,929,712 A * 7/1999 Kuriyama .................... 331/25

2002/0008592 A1 * 1/2002 Yoshisato et al. ............. 331/75

FOREIGN PATENT DOCUMENTS

| DE | 32 11 803 A1 | 10/1983 |
|---|---|---|
| DE | 32 46 295 A1 | 6/1984 |
| JP | 57-031206 | 2/1982 |
| JP | 08-288715 | 11/1996 |
| JP | 2000-312115 | 11/2000 |
| JP | 2001-284962 | 10/2001 |
| JP | 2002-204126 | 7/2002 |

OTHER PUBLICATIONS

Donald L. Schilling, Charles Belove. "Electronics Circuits Discrete and Integrated" Second Edition, McGraw–Hill, Inc., 1979, p. 135.*

Kennedy, "Electronic Communication Systems" Second Edition, McGraw Hill, Inc., 1977, p. 363.*

* cited by examiner

*Primary Examiner*—Robert Pascal
*Assistant Examiner*—Joseph Chang
(74) *Attorney, Agent, or Firm*—Keating & Bennett, LLP

(57) ABSTRACT

A voltage controlled oscillator includes a resonant circuit which is connected with an active circuit. In the resonant circuit, a variable capacitance diode is connected with a resonator via a transmission line, and a capacitive circuit is connected in parallel with the variable capacitance diode. By setting the length of the transmission line to an appropriate value ranging from, for example, about one quarter to about one half of the wavelength of the resonant frequency, the frequency change width can increase, while maintaining the frequency linearity because of connection of the capacitive circuit.

16 Claims, 7 Drawing Sheets

VOLTAGE-CONTROLLED OSCILLATOR HAVING A TRANSMISSION LINE BETWEEN A RESONATOR AND A VARIABLE CAPACITANCE DIODE, HIGH-FREQUENCY MODULE INCLUDING THE SAME, AND COMMUNICATION APPARATUS INCLUDING THE SAME

BACKGROUND OF THE INVENTION

1. Field of the Invention

The present invention relates to a voltage-controlled oscillator suitable for generation of high-frequency electromagnetic waves (high-frequency signals) such as microwaves and millimeter waves, a high-frequency module including such a voltage-controlled oscillator, and a communication apparatus including such a voltage-controlled oscillator.

2. Description of the Related Art

In general, voltage controlled oscillators for high-frequency signals include a resonant circuit and an active circuit for amplifying a signal output from the resonant circuit, and the resonant circuit includes a resonator having a predetermined resonant frequency, and a variable capacitance diode connected to the resonator for shifting the resonant frequency according to a control voltage.

In the related art, a voltage-controlled oscillator having a parallel connection of a variable capacitance diode and a series-connected circuit including a strip line having a length that is equal to or less than one quarter of the wavelength of the resonant frequency and a capacitor is described in, for example, Japanese Unexamined Patent Application Publication No. 8-288715 and No. 2001-284962.

In such a voltage-controlled oscillator of the related art, for example, the trailing end of the strip line is grounded via the low-impedance capacitor, thus allowing the overall series-connected circuit of the strip line and the capacitor to function as a dielectric circuit, in which the capacitance of the combining circuit of the variable capacitance diode and the series connected circuit varies in inverse proportion to the square of the control voltage. Since the resonant frequency is in inverse proportion to the square root (one-half power) of the capacitance of the combining circuit, the resonant frequency varies linearly with respect to the control voltage, so that the change in linear capacitance with respect to the control voltage is corrected.

Typically, the resonator is connected with the variable capacitance diode using a transmission line such as a microstrip line. When observing the side of the variable capacitance diode from the resonator, the impedance of a combiner of the variable capacitance diode and the transmission line defines the resonant frequency. In the above-described device of the related art, however, the effect of the transmission line is not considered, leading to a problem that the linearity of the resonant frequency does not necessarily increase.

SUMMARY OF THE INVENTION

In order to overcome the problems described above, preferred embodiments of the present invention provide a voltage-controlled oscillator, a high-frequency module, and a communication apparatus with improved frequency linearity with respect to a control voltage even when a transmission line is disposed between a resonator and a variable capacitance diode.

According to a preferred embodiment of the present invention, a voltage-controlled oscillator includes a resonant circuit and an active circuit for amplifying a signal output from the resonant circuit, and the resonant circuit includes a resonator having a predetermined resonant frequency, and a variable capacitance diode connected to the resonator for shifting the resonant frequency according to a control voltage.

In the voltage-controlled oscillator, a transmission line is connected between the resonator and the variable capacitance diode, and a capacitive circuit is connected in parallel with the variable capacitance diode.

For example, without the capacitive circuit, the optimum linearity of the resonant frequency is obtained when the length of the transmission line is about one quarter ($\lambda/4$) of the wavelength $\lambda$ of the resonant frequency, although the frequency change width is minimized. With the capacitive circuit, in contrast, the optimum linearity of the resonant frequency is obtained when the length of the transmission line is a value greater than one quarter ($\lambda/4$) of the wavelength $\lambda$ of the resonant frequency, and the frequency change width increases. Accordingly, the linearity of the resonant frequency can be improved while maintaining the desired frequency change width.

The capacitive circuit may be an open stub defined by another transmission line having one end connected between the variable capacitance diode and the transmission line and the other end which is open.

By setting the length of the open stub to, for example, a value that is equal to or lower than approximately one quarter of the wavelength of the resonant frequency, a desirable capacitive circuit can be achieved.

The capacitive circuit may be a capacitor connected in parallel with the variable capacitance diode. When the capacitive circuit can be a lumped circuit, e.g., when the resonant frequency is low, a single capacitor is connected in parallel, thereby readily providing a desired capacitive circuit.

Preferably, the capacitive circuit has a smaller capacitance than the variable capacitance diode, and the transmission line has a length ranging from about one quarter to about one half of the wavelength of the resonant frequency of the resonant circuit.

With the capacitive circuit connected in parallel with the variable capacitance diode, the optimum linearity of the resonant frequency is obtained when the length of the transmission line is a value that is greater than about one quarter ($\lambda/4$) of the wavelength $\lambda$ of the resonant frequency. By setting the length of the transmission line to an appropriate value ranging from about one quarter ($\lambda/4$) to about one half ($\lambda/2$) of the wavelength $\lambda$ of the resonant frequency, an impedance change caused by the capacitive circuit can be compensated with the transmission line to optimize the linearity of the resonant frequency and to give a larger frequency change width than the frequency change width without the capacitive circuit.

The resonator may be a dielectric resonator. The dielectric resonator provides a higher Q factor of the overall resonant circuit, resulting in a higher carrier-to-noise (C/N) ratio. However, the resonant frequency change width with respect to the control voltage tends to be low. With the transmission line connected between the resonator and the variable capacitance diode and with the capacitive circuit connected in parallel with the variable capacitance diode, the resonant frequency change width can increase while maintaining the desired frequency linearity. Therefore, the linearity of the resonant frequency, the frequency change width, and the C/N ratio can be improved simultaneously.

In another preferred embodiment of the present invention, a high-frequency module includes the voltage-controlled oscillator according to preferred embodiments of the present invention described above.

In another aspect of the present invention, a communication apparatus includes the voltage-controlled oscillator according to preferred embodiments of the present invention described above.

Other features, elements, characteristics and advantages of the present invention will become more apparent from the following detailed description of preferred embodiments thereof with reference to the attached drawings.

DETAILED DESCRIPTION OF PREFERRED EMBODIMENTS

A voltage-controlled oscillator, a high-frequency module, and a communication apparatus according to preferred embodiments of the present invention are described in detail below with reference to the accompanying drawings.

Figure 1:
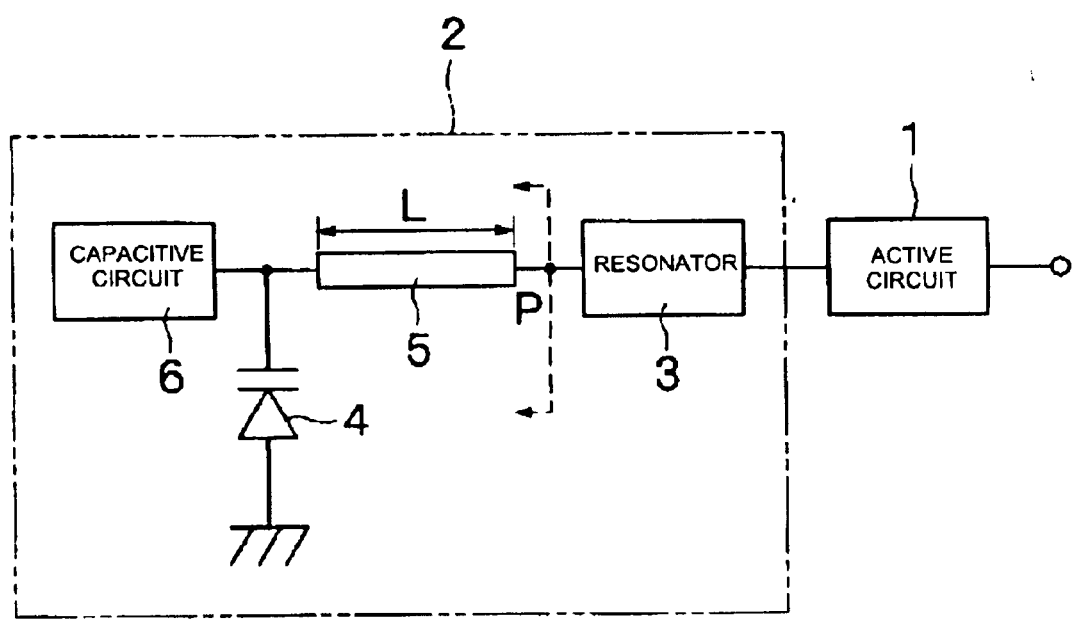
FIG. 1 is a block diagram of a voltage-controlled oscillator according to a first preferred embodiment of the present invention.

FIG. 1 shows a voltage-controlled oscillator according to a first preferred embodiment of the present invention. In FIG. 1, an active circuit 1 is connected with a resonant circuit 2, and includes, for example, a field-effect transistor which is an electronic component, and so on. The active circuit 1 amplifies a signal output from the resonant circuit 2.

The resonant circuit 2 outputs a high-frequency signal having a frequency according to a control voltage Vc to the active circuit 1. The resonant circuit 2 includes a resonator 3, a variable capacitance diode 4, a transmission line 5, and a capacitive circuit 6.

The resonator 3 has a predetermined resonant frequency A, and includes, for example, a microstrip line, a dielectric resonator, or other suitable element. One end of the resonator 3, which defines the output side, is connected with the active circuit 1.

The variable capacitance diode 4 is connected with the other end of the resonator 3 via the transmission line 5. The variable capacitance diode 4, which may be a varactor diode, a varicap diode, or other suitable element, has a cathode connected with the transmission line 5, and an anode that is grounded. A variable capacitance Cv of the variable capacitance diode 4 varies according to the control voltage applied to the cathode thereof, thus causing the resonant frequency ω of the resonator 3 to be shifted to the resonant frequency ω0. The capacitance Cv of the variable capacitance diode 4 is preferably set to a value ranging from, for example, about 2 pF to about 0.3 pF (Cv=2 pF to 0.3 pF).

The transmission line 5 is connected between the resonator 3 and the variable capacitance diode 4, and may be a strip line, a microstrip line, a slot line, or other suitable element. The transmission line 5 preferably has a length L close to, for example, about one quarter of the wavelength λ of the resonant frequency ω0, ranging from about one quarter to about one half of the wavelength λ, i.e., λ/4<L<λ/2.

The capacitive circuit 6 is connected in parallel with the variable capacitance diode 4, and may be an open stub, a capacitor, or other suitable element. The capacitive circuit 6 has a constant capacitance Cc, and the capacitance Cc of the capacitive circuit 6 is preferably set to a value smaller than the capacitance Cv of the variable capacitance diode 4. Given the capacitance Cv of the variable capacitance diode 4 set to a value ranging from, for example, about 2 pF to about 0.3 pF (Cv=2 pF to 0.3 pF), the capacitance Cc of the capacitive circuit 6 is set to a value ranging from about 0.005 pF to about 0.1 pF (Cc=0.005 pF to 0.1 pF).

In the voltage-controlled oscillator with the above-described structure according to the first preferred embodiment, the operation of the transmission line 5 and the capacitive circuit 6 is described below.

Without the capacitive circuit 6, impedance Zv of the variable capacitance diode 4 as observed from a point P between the resonator 3 and the transmission line 5 is given by Eq. (1)

$$Z_V = Z_L \frac{j\omega 0 C_V R_C + 1 + j\omega 0 C_V Z_L \tanh\{(\alpha + j\beta)L\}}{j\omega 0 C_V Z_L + (j\omega 0 C_V R_C + 1)\tanh\{(\alpha + j\beta)L\}} \quad \text{Eq. (1)}$$

where $Z_L$ denotes the characteristic impedance of the transmission line 5, ω0 denotes the resonant frequency of the resonant circuit 2, Rc denotes loss of the variable capacitance diode 4, α denotes the attenuation coefficient, and β denotes the phase coefficient.

When the term of Eq. (1) which affects the frequency change is calculated, then the impedance Zv corresponds to a reactance $$Z_V = jZ_L \frac{\omega 0 C_V Z_L \tan\beta L - 1}{\omega 0 C_V Z_L + \tan\beta L} = jX_V \quad \text{Eq. (2)}$$

As is apparent from Eq. (2), the frequency change is defined by both the capacitance Cv of the variable capacitance diode 4 and the length L of the transmission line 5. Then, the frequency linearity A and the frequency change width B when the length L of the transmission line 5 changes is calculated using Eq. (2). The resulting frequency linearity A and frequency change width B are indicated by characteristic lines 7 and 8 shown in FIG. 2, respectively, where the applied control voltage ranges from about 3 V to about 9 V. The frequency linearity A is given by, for example, the following equation:

$$\text{Linearity} A = \frac{\frac{\partial f(V_{c}2)}{\partial V_{C}0} - \frac{\partial f(V_{c}1)}{\partial V_{C}0}}{\frac{\partial f(V_{C}2)}{\partial V_{C}0}} \times 100 \qquad \text{Eq. (3)}$$

where f(Vc) represents a function indicating the resonant frequency when the control voltage Vc is applied, and Vc0, Vc1, and Vc2 indicate control voltages, such that Vc0=6 V, Vc1=3 V, and Vc2=9 V.

Figure 2:
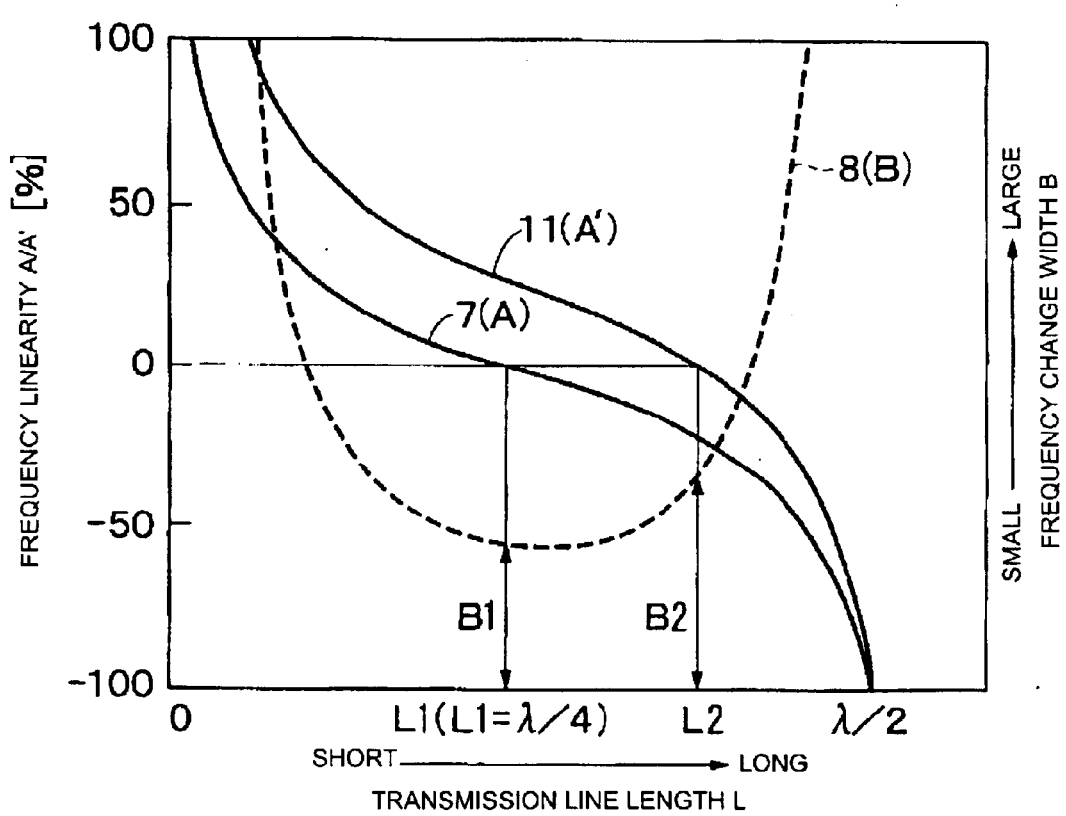
FIG. 2 is a characteristic diagram showing a relationship between the length of a transmission line shown in FIG. 1 and the frequency linearity, and a relationship between the length of a transmission line and the frequency change width.
Figure 3:
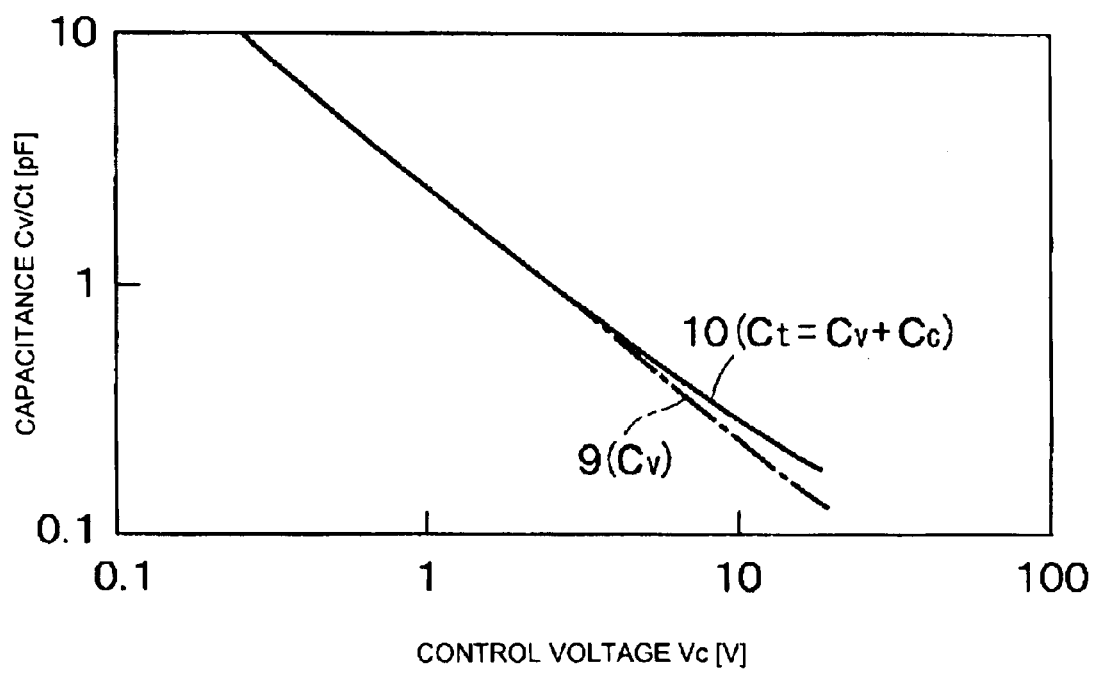
FIG. 3 is a characteristic diagram showing a relationship between a control voltage and the capacitance of a variable capacitance diode, and a relationship between the control voltage and the combined capacitance of the variable capacitance diode and a capacitive circuit.

As is indicated by the characteristic line 7 shown in FIG. 2, the frequency linearity A greatly changes depending upon the length L of the transmission line 5, and the optimum linearity A (0%) is obtained when the length L of the transmission line 5 is set to length L1 of about one quarter (λ/4) of the wavelength λ of the resonant frequency ω0. The capacitance Cv of the variable capacitance diode 4 is substantially in inverse proportion to the control voltage Vc, as indicated by a characteristic line 9 shown in FIG. 3.

As is indicated by the characteristic line 8 shown in FIG. 2, the frequency change width B has substantially the minimum value B1 when the length L of the transmission line 5 is preferably set to the length L1.

Specifically, when the length L of the transmission line 5 is set to about a quarter-wavelength, the impedance of the tangent term of Equation (2) is high, resulting in the maximum impedance Zv (jXv) of the variable capacitance diode 4 as observed from the point P shown in FIG. 1. This causes a small change of the impedance Zv as the capacitance Cv of the variable capacitance diode 4 changes, so that the frequency change width B is minimized. In a voltage-controlled oscillator which is configured such that the resonator 3 and the variable capacitance diode 4 are connected with each other using the transmission line 5, the length L of the transmission line 5 can be set as desired to increase the frequency linearity A, although the frequency change width B is low.

In the voltage-controlled oscillator of the first preferred embodiment, on the other hand, the capacitive circuit 6 and the variable capacitance diode 4 are connected in parallel with each other. The combined capacitance Ct of the variable capacitance diode 4 and the capacitive circuit 6 is obtained by summing the capacitance Cv of the variable capacitance diode 4 and the capacitance Cc of the capacitive circuit 6, i.e., Ct=Cv+Cc. A characteristic line 10 shown in FIG. 3 indicating the combined capacitance Ct is deviated from the characteristic line 9 inversely proportional to the control voltage Vc.

The frequency linearity A' of the voltage-controlled oscillator of the first preferred embodiment with respect to a change of the length L of the transmission line 5 is calculated using Equation (2), in which the capacitance Cv is replaced with the combined capacitance Ct. The resulting frequency linearity A' is indicated by a characteristic line 11 shown in FIG. 2.

As is indicated by the characteristic line 11 shown in FIG. 2, the length L of the transmission line 5 with respect to the optimum linearity A' (0%) is shifted to length L2 from the length L1 indicated by the characteristic line 7 exhibited by the voltage-controlled oscillator without the capacitive circuit 6.

Specifically, the linearity A' indicated by the characteristic line 11 exhibited by the voltage-controlled oscillator with the capacitive circuit 6 is generally shifted toward the positive (plus) side with respect to the linearity A indicated by the characteristic line 7 exhibited by the voltage-controlled oscillator without the capacitive circuit 6. As the length L of the transmission line 5 increases, however, the linearity A' changes toward the negative (minus) side. As a result, the positively shifted portion of the linearity A' caused by the capacitive circuit 6 is compensated with the transmission line 5, and is cancelled when the length L is set to the length L2, resulting in the optimum linearity A' (0%).

In the voltage-controlled oscillator with the capacitive circuit 6, the frequency change width B is also low and exhibits a characteristic line substantially similar to the characteristic line 8. Specifically, since the tangent term of Eq. (2) relating to the length L of the transmission line 5 more greatly changes depending upon the length L than the combined capacitance Ct, the frequency change width B is more affected by the length L of the transmission line 5 than by replacing the capacitance Cv of the variable capacitance diode 4 with the combined capacitance Ct. As indicated by the characteristic line 8 shown in FIG. 2, when the length L of the transmission line 5 is set to the length L2, the frequency change width B has a value B2 higher than the value B1 when the length L is set to the length L1.

In the first preferred embodiment, therefore, the capacitive circuit 6 and the variable capacitance diode 4 are connected in parallel with each other, and the length L of the transmission line 5 which connects the resonator 3 to the variable capacitance diode 4 is set as desired, thereby increasing the frequency change width B and the frequency linearity A'.

Since the transmission line 5 with a desired length L is used to connect the resonator 3 and the variable capacitance diode 4, the frequency linearity A' can be improved, unlike the voltage-controlled oscillator of the related art in which the frequency linearity A is reduced due to the effect of the transmission line 5.

In the first preferred embodiment, since the capacitance Cc of the capacitive circuit 6 is set to a value smaller than the capacitance Cv of the variable capacitance diode 4, and the length L of the transmission line 5 is set to a value ranging from about one quarter to about one half of the wavelength λ of the resonant frequency ω0, the change in impedance Zv caused by the capacitive circuit 6 can be compensated with the transmission line 5. Thus, the optimum frequency linearity A' can be obtained, and a larger frequency change width B than that of the voltage-controlled oscillator without the capacitive circuit 6 can also be obtained.

In the first preferred embodiment, the length L of the transmission line 5 is set to a value ranging from about one quarter to about one half of the wavelength λ of the resonant frequency ω0, i.e., λ/4<L<λ/2. As is given by Eq. (2), the impedance Zv periodically changes with respect to the length L of the transmission line 5, and the length L of the transmission line 5 may be therefore set to a value of (2n−1)λ/4<L<(n+1) λ/2, where n indicates an integer.

Figure 4:
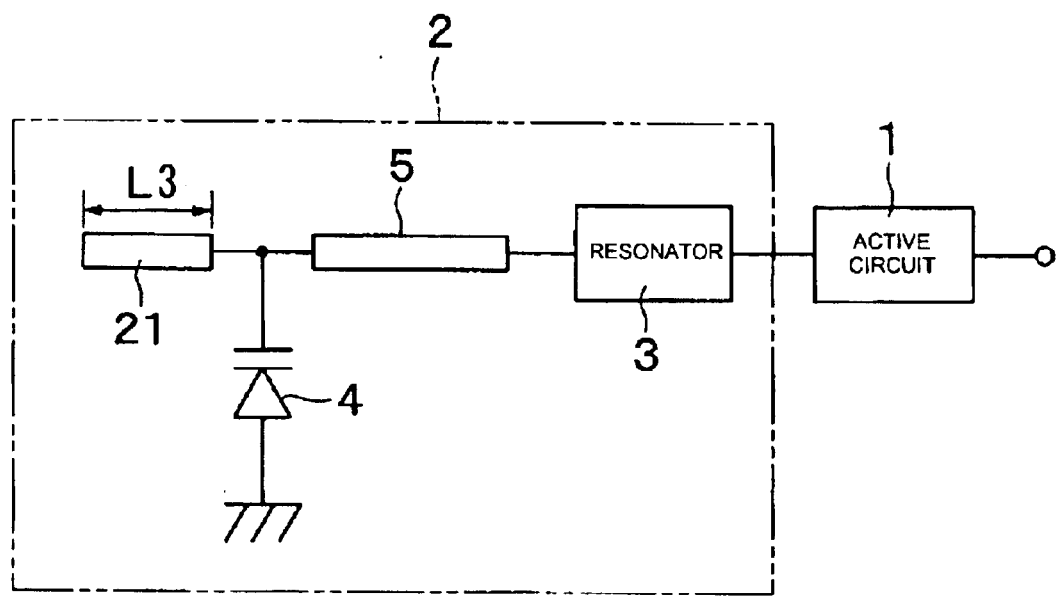
FIG. 4 is a block diagram of a voltage-controlled oscillator according to a second preferred embodiment of the present invention.

FIG. 4 shows a voltage-controlled oscillator according to a second preferred embodiment of the present invention. In the second preferred embodiment, an open stub 21 defined by another transmission line with the open trailing end is used for the capacitive circuit 6 of the first preferred embodiment. In the second preferred embodiment, the same components as those of the first preferred embodiment are designated by the same reference numerals, and a description thereof is omitted.

The open stub 21 defines a capacitive circuit, and includes, for example, a strip line, a microstrip line, a slot line, or other suitable element, like the transmission line 5. The open stub 21 has one end connected between the variable capacitance diode 4 and the transmission line 5, and the other end which is open. A length L3 of the open stub 21 is preferably set to a value that is equal to or less than, for example, about one quarter of the wavelength λ of the resonant frequency ω0, i.e., 0<L3≦λ/4, so that the open stub 21 is capacitive.

The open stub 21 is periodically capacitive and dielectric in an alternate manner as the length L3 of the open stub 21 increases. Therefore, the length L3 of the open stub 21 may be set to a value of nλ/2<L3≦(2n+1)λ/4, where λ denotes the wavelength of the resonant frequency ω0 and n indicates an integer.

Accordingly, similar advantages achieved by the first preferred embodiment can also be achieved by the second preferred embodiment. In the second preferred embodiment, since the open stub 21 defined by a strip line or other suitable element defines a capacitive circuit, the open stub 21 can be disposed on a substrate or the like together with the transmission line 5. It is not necessary to assemble parts, unlike a capacitive circuit defined by a capacitor or the like, thus increasing the productivity.

Figure 5:
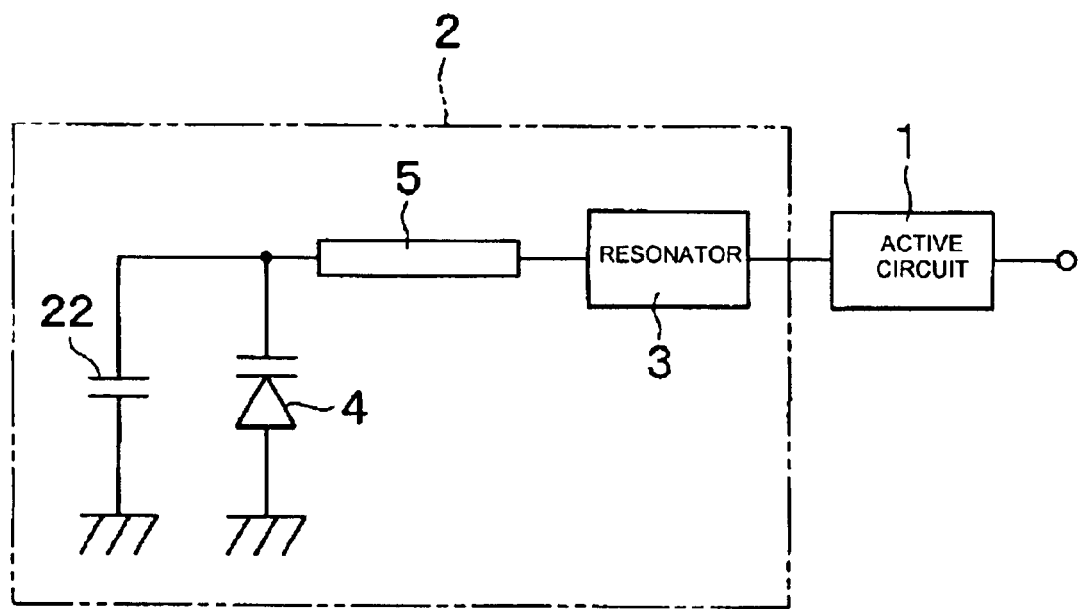
FIG. 5 is a block diagram of a modified voltage-controlled oscillator of a preferred embodiment of the present invention.

For example, when the resonant frequency ω0 is relatively low, as a modification shown in FIG. 5, the capacitive circuit according to preferred embodiments of the present invention may be a capacitor 22. In this modification, the capacitor 22 is connected in parallel with the variable capacitance diode 4, and one end of the capacitor 22 is connected between the variable capacitance diode 4 and the transmission line 5 while the other end is grounded.

Figure 6:
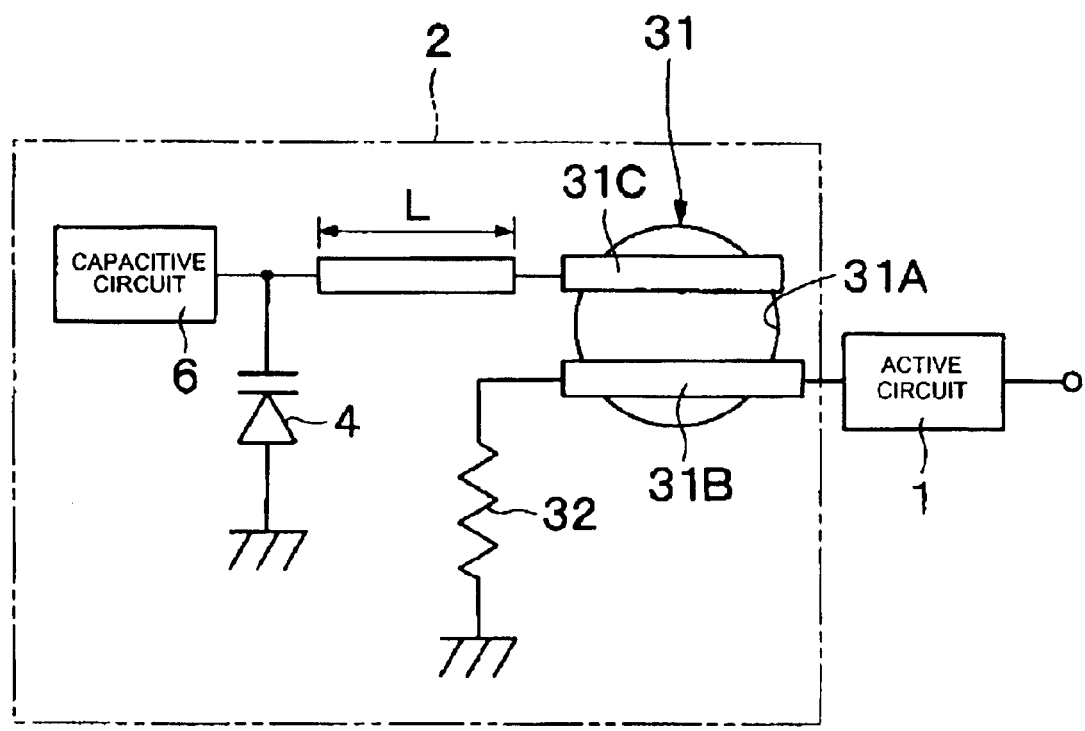
FIG. 6 is a block diagram of a voltage-controlled oscillator according to a third preferred embodiment of the present invention.

FIG. 6 shows a voltage-controlled oscillator according to a third preferred embodiment of the present invention. In the third preferred embodiment, a dielectric resonator 31 is preferably provided in place of the resonator 3 of the first preferred embodiment. In the third preferred embodiment, the same components as those of the first preferred embodiment are designated by the same reference numerals, and a description thereof is omitted.

The dielectric resonator 31 is preferably formed of, for example, a TE010-mode resonator resonated at a TE010 mode, or a TE01δ-mode resonator resonated at a TE01δ mode. The dielectric resonator 31 includes facing electrodes disposed on both surfaces of a substrate, each electrode having a substantially round opening 31A, as shown in, for example, Japanese Unexamined Patent Application Publication No. 11-239021. The opening 31A is provided with parallel coupling lines 31B and 31C including microstrip lines or other suitable elements.

The coupling line 31B has an end connected to the active circuit 1 and the other end grounded via a terminating resistor 32. The coupling line 31C has an open end and the other end connected to the transmission line 5.

Accordingly, similar advantages to those of the first preferred embodiment can also be achieved by the third preferred embodiment. Furthermore, the resonant circuit 2 of the third preferred embodiment which includes a resonator defined by the dielectric resonator 31 can have a higher Q factor than a resonant circuit which includes a resonator defined by, for example, a quarter-wavelength microstrip line. In general, as the Q factor of the resonant circuit 2 increases, the carrier-to-noise (C/N) ratio also increases. However, the frequency change width with respect to the control voltage Vc tends to be low. In the third preferred embodiment, however, the length L of the transmission line 5 can be adjusted to greatly increase the frequency change width as well as the frequency linearity because of connection of the capacitive circuit 6. Therefore, the frequency change width can be increased, and the C/N ratio can also be increased while maintaining the frequency linearity.

Figure 7:
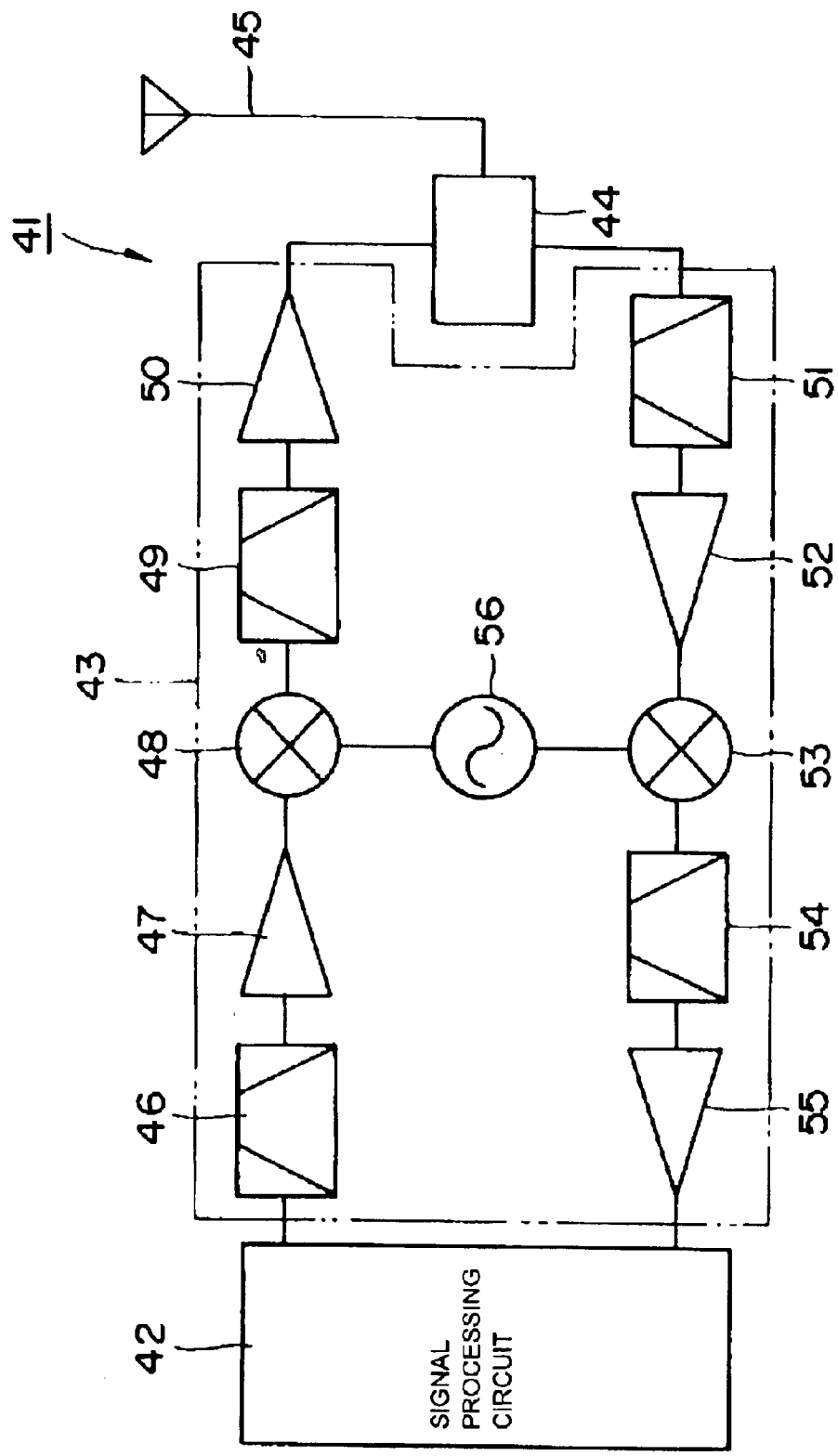
FIG. 7 is a block diagram of a communication apparatus according to a fourth preferred embodiment of the present invention.

FIG. 7 shows a communication apparatus 41 according to a fourth preferred embodiment of the present invention. In the fourth preferred embodiment, the communication apparatus, particularly, a high-frequency module, includes the voltage-controlled oscillator.

The communication apparatus 41 according to the fourth preferred embodiment includes, for example, a signal processing circuit 42, a high-frequency module 43 connected to the signal processing circuit 42 for outputting or inputting a high-frequency signal, and an antenna 45 connected to the high-frequency module 43 for transmitting or receiving a high-frequency signal via an antenna duplexer 44.

The high-frequency module 43 includes a transmitter connected between the output side of the signal processing circuit 42 and the antenna duplexer 44, and a receiver connected between the antenna duplexer 44 and the input side of the signal processing circuit 42. The transmitter includes a band-pass filter 46, an amplifier 47, a mixer 48, a band-pass filter 49, and a power amplifier 50, and the receiver includes a band-pass filter 51, a low-noise amplifier 52, a mixer 53, a band-pass filter 54, and an amplifier 55. A voltage-controlled oscillator 56 according to any one of the first through third preferred embodiments is connected to the mixers 48 and 53.

The operation of the communication apparatus of the fourth preferred embodiment with the above-described structure is now described.

For transmission, an intermediate-frequency signal (IF signal) output from the signal processing circuit 42 is passed to the band-pass filter 46 where an unwanted signal is removed therefrom, and the resulting IF signal is then amplified by the amplifier 47 and input to the mixer 48. The mixer 48 multiplies the IF signal by a carrier wave from the voltage-controlled oscillator 56 so as to be up-converted into a high-frequency signal (RF signal). The RF signal output from the mixer 48 is passed to the band-pass filter 49 where an unwanted signal is removed therefrom, and the resulting signal is amplified to transmission power by the power amplifier 50, which is then transmitted from the antenna 45 via the antenna duplexer 44.

For reception, an RF signal received by the antenna 45 is input to the band-pass filter 51 via the antenna duplexer 44. An unwanted signal is removed from the RF signal by the band-pass filter 51, and the resulting RF signal is then amplified by the low-noise amplifier 52 and input to the mixer 53. The mixer 53 multiples the RF signal by a carrier wave from the voltage-controlled oscillator 56 so as to be down-converted into an IF signal. The IF signal output from the mixer 53 is passed to the band-pass filter 54 where an unwanted signal is removed therefrom, and the resulting IF signal is amplified by the amplifier 55 and input to the signal processing circuit 42.

In the fourth preferred embodiment, therefore, the communication apparatus 41 includes the voltage-controlled oscillator 56 which increases the frequency change width while maintaining the frequency linearity, thus achieving a broader modulation bandwidth of the communication apparatus 41.

In the fourth preferred embodiment, a high-frequency oscillation circuit according to the present invention is applied to a communication apparatus, but may also be applied to, for example, a radar apparatus, and so on.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A voltage-controlled oscillator comprising:

a resonant circuit; and an active circuit for amplifying a signal output from the resonant circuit; wherein said resonant circuit includes a resonator having a predetermined resonant frequency, a variable capacitance diode connected to the resonator for shifting the resonant frequency according to a control voltage, a transmission line connected between the resonator and the variable capacitance diode, and a capacitive circuit connected in parallel with the variable capacitance diode; and said transmission line is connected in series with said resonator.

2. A voltage-controlled oscillator according to claim 1, wherein the capacitive circuit includes an open stub which includes another transmission line having one end connected between the variable capacitance diode and the transmission line and the other end which is open.

3. A voltage-controlled oscillator according to claim 1, wherein the capacitive circuit includes a capacitor which is connected inn parallel with the variable capacitance diode.

4. A voltage-controlled oscillator according to claim 1, wherein the capacitive circuit has a smaller capacitance than the variable capacitance diode, and the transmission line has a length ranging from about one quarter to about one half to the wavelength of the resonant frequency of the resonant circuit.

5. A voltage-controlled oscillator according to claim 1, wherein the resonator is defined by a dielectric resonator.

6. A voltage-controlled oscillator according to claim 1, wherein the active circuit includes a field-effect transistor.

7. A voltage-controlled oscillator according to claim 1, wherein the resonant includes at least one of a microstrip line and a dielectric resonator.

8. A voltage-controlled oscillator according to claim 1, wherein one end of the resonator is connected with the active circuit.

9. A voltage-controlled oscillator according to claim 1, wherein the variable capacitance diode is connected with one end of the resonator via the transmission line.

10. A voltage-controlled oscillator according to claim 1, wherein the variable capacitance diode has a cathode connected with the transmission line and an anode that is grounded.

11. A voltage-controlled oscillator according to claim 1, wherein a variable capacitance of the variable capacitance diode varies according to the control voltage applied to the cathode thereof, causing the resonant frequency of the resonator to be shifted.

12. A voltage-controlled oscillator according to claim 1, wherein the transmission line is connected between the resonator and the variable capacitance diode.

13. A voltage-controlled oscillator according to claim 1, wherein the capacitive circuit is connected in parallel with the variable capacitance diode.

14. A voltage-controlled oscillator according to claim 1, wherein the capacitive circuit has a constant capacitance and the capacitance of the capacitive circuit is set to a value that is smaller than the capacitance of the variable capacitance diode.

15. A high-frequency module comprising the voltage-controlled oscillator according to claim 1.

16. A communication apparatus comprising the voltage-controlled oscillator according to claim 1.

* * * * *